(12) United States Patent
Suk et al.

(10) Patent No.: US 9,362,311 B1
(45) Date of Patent: Jun. 7, 2016

(54) METHOD OF FABRICATING SEMICONDUCTOR DEVICE

(71) Applicant: SAMSUNG ELECTRONICS CO., LTD., Suwon-Si, Gyeonggi-Do (KR)

(72) Inventors: Sung-Dae Suk, Seoul (KR); Kang-Ill Seo, Chungcheongbuk-Do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/808,027

(22) Filed: Jul. 24, 2015

(51) Int. Cl.
*H01L 27/12* (2006.01)
*H01L 29/66* (2006.01)
*H01L 21/02* (2006.01)

(52) U.S. Cl.
CPC ...... *H01L 27/1211* (2013.01); *H01L 21/02532* (2013.01); *H01L 21/02694* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,805,962 B2 | 10/2004 | Bedell et al. | |
| 7,323,710 B2 * | 1/2008 | Kim | H01L 29/66795 257/19 |
| 7,348,284 B2 | 3/2008 | Doyle et al. | |
| 7,550,370 B2 | 6/2009 | Chen et al. | |
| 7,564,081 B2 | 7/2009 | Zhu et al. | |
| 7,705,345 B2 | 4/2010 | Bedell et al. | |
| 8,058,157 B2 | 11/2011 | Zhu et al. | |
| 8,486,811 B2 | 7/2013 | Narihiro | |
| 8,536,029 B1 | 9/2013 | Chang et al. | |
| 8,703,565 B2 | 4/2014 | Chang et al. | |
| 8,748,940 B1 * | 6/2014 | Rachmady | B82Y 40/00 257/190 |
| 2007/0275513 A1 * | 11/2007 | Coronel | H01L 29/78684 438/151 |
| 2008/0050883 A1 * | 2/2008 | Enicks | H01L 29/161 438/312 |
| 2008/0135949 A1 * | 6/2008 | Lo | B82Y 10/00 257/401 |
| 2009/0127584 A1 * | 5/2009 | Morand | H01L 29/785 257/192 |
| 2014/0246723 A1 * | 9/2014 | Morand | H01L 29/66795 257/347 |
| 2014/0273397 A1 * | 9/2014 | Rodder | H01L 21/76 438/400 |
| 2015/0001595 A1 * | 1/2015 | Morin | H01L 29/7849 257/288 |
| 2015/0303197 A1 * | 10/2015 | Ching | H01L 29/66439 257/9 |

FOREIGN PATENT DOCUMENTS

JP 2003-282932 10/2003

* cited by examiner

*Primary Examiner* — Charles Garber
*Assistant Examiner* — Evren Seven
(74) *Attorney, Agent, or Firm* — F. Chau & Associate, LLC

(57) ABSTRACT

A method of fabricating a semiconductor device is provided. A first semiconductor layer including Ge at a first concentration is formed on an insulation layer. Second and third semiconductor layers are formed sequentially on the first semiconductor layer. The second and third semiconductor layers include Ge at second and third concentrations higher than the first concentration. A fin type structure is formed by patterning the insulation layer and the first to third semiconductor layers. The fin type structure is vertically protruded. A fin type active pattern is formed on the fin type structure by performing a first thermal process on the fin type structure. The fin type active pattern includes Ge at a fourth concentration higher than the first concentration and lower than the second concentration.

20 Claims, 26 Drawing Sheets

1200

1400

METHOD OF FABRICATING SEMICONDUCTOR DEVICE

TECHNICAL FIELD

The present inventive concept relates to a method of fabricating a semiconductor device.

DISCUSSION OF RELATED ART

Ge condensation is used in fabricating a SiGe layer on insulator (SGOI) substrate. The use of the Ge condensation may generate a SiGe layer having a low Ge concentration without causing a defect (for example, a Ge ratio of approximately 25%). However, when a fin type active pattern including SiGe having a high Ge concentration is generated, Ge condensation may cause a defect or dislocation.

SUMMARY

According to an exemplary embodiment of the present inventive concept, a method of fabricating a semiconductor device is provided. A first semiconductor layer including Ge at a first concentration is formed on an insulation layer. Second and third semiconductor layers are formed sequentially on the first semiconductor layer. The second and third semiconductor layers include Ge at second and third concentrations higher than the first concentration. A fin type structure is formed by patterning the insulation layer and the first to third semiconductor layers. The fin type structure is vertically protruded. A fin type active pattern is formed on the fin type structure by performing a first thermal process on the fin type structure. The fin type active pattern includes Ge at a fourth concentration higher than the first concentration and lower than the second concentration.

A method of fabricating a semiconductor device is provided. A first semiconductor layer including Si is formed on a substrate. The first semiconductor layer does not include Ge. A second semiconductor layer including Ge at a first concentration is formed on the first semiconductor layer. A first thermal process is performed on the first semiconductor layer and the second semiconductor layer to form a third semiconductor layer having Ge at a second concentration. Fourth and fifth semiconductor layers are formed sequentially on the third semiconductor layer. The fourth and fifth semiconductor layers include Ge at third and fourth concentrations higher than the second concentration. The third to fifth semiconductor layers are patterned to form a fin type structure. A preliminary fin type active pattern including Ge at a fifth concentration higher than the second concentration and lower than the third concentration is formed by performing a second thermal process on the fin type structure. A surface of the preliminary fin type active pattern is oxidized to form a fin type active pattern including Ge at a sixth concentration greater than the fifth concentration.

A method of fabricating a semiconductor device is provided. A plurality of semiconductor layers including Ge and Si is formed on a substrate. The semiconductor layers have different concentrations of Ge from each other. The semiconductor layers are patterned to form at least one fin type structures. A thermal heat process is performed to form at least one preliminary fin type active patterns. Ge of the patterned semiconductor layers is diffused so that the preliminary fin type active patterns includes Ge at a first concentration. Surfaces of the preliminary fin type active patterns are oxidized to form a plurality of fin type active patterns. The fin type active patterns include Ge at a second concentration that is greater than the first concentration.

BRIEF DESCRIPTION OF THE DRAWINGS

These and other features of the inventive concept will become more apparent by describing For example exemplary embodiments thereof with reference to the accompanying drawings of which.

DETAILED DESCRIPTION OF EXEMPLARY EMBODIMENTS

Figure 1:
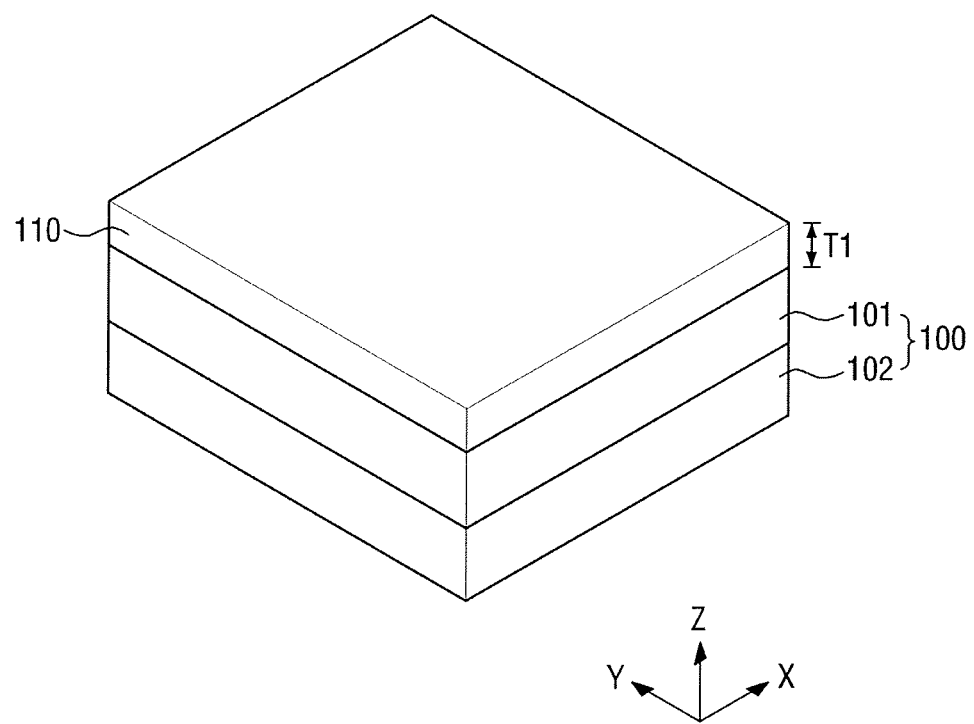
FIGS. 1 to 7 illustrate intermediate process steps in a method for fabricating a semiconductor device according to an exemplary embodiment of the present inventive concept.

Exemplary embodiments of the inventive concept will be described below For example with reference to the accompanying drawings. However, the inventive concept is embodied in different forms and should not be construed as limited to the embodiments set forth herein. In the drawings, the thickness of layers and regions is exaggerated for clarity. It will also be understood that when an element is referred to as being "on" another element or substrate, it is directly on the other element or substrate, or intervening layers may also be present. It will also be understood that when an element is referred to as being "coupled to" or "connected to" another element, it is directly coupled to or connected to the other element, or intervening elements may also be present. Like reference numerals may refer to the like elements throughout the specification and drawings.

Hereinafter, a method for fabricating a semiconductor device according to an exemplary embodiment of the present inventive concept will be described with reference to FIGS. 1 to 7.

FIGS. 1 to 7 illustrate intermediate process steps in a method of fabricating a semiconductor device according to an exemplary embodiment of the present inventive concept.

Referring to FIG. 1, a first semiconductor layer 110 is formed on a substrate 100.

For example, the substrate 100 may be bulk silicon or a silicon-on-insulator (SOI).

The substrate 100 includes a lower substrate 102 and an upper substrate 101 formed on one surface of the lower substrate 102. For example, the lower substrate 102 may be a semiconductor substrate and the upper substrate 101 may be an insulating layer substrate. For example, the substrate 100 may include a semiconductor substrate and an insulating layer substrate. For example, the substrate (100) may include a semiconductor substrate and an insulating layer substrate formed on one surface of the semiconductor substrate, for example, a silicon-on-insulator (SOI). Here, the lower substrate 102 may be a silicon substrate. Alternatively, the lower substrate 102 may be a substrate formed of germanium, silicon germanium, indium antimonide, lead telluride compound, indium arsenide, indium phosphide, gallium arsenide, or gallium antimonide. The present inventive concept is not limited thereto.

The first semiconductor layer 110 may be, for example, silicon (Si).

For example, a vertical thickness of the first semiconductor layer 110 in a third direction Z is a first thickness T1. The first semiconductor layer 110 need not include Ge.

Figure 2:
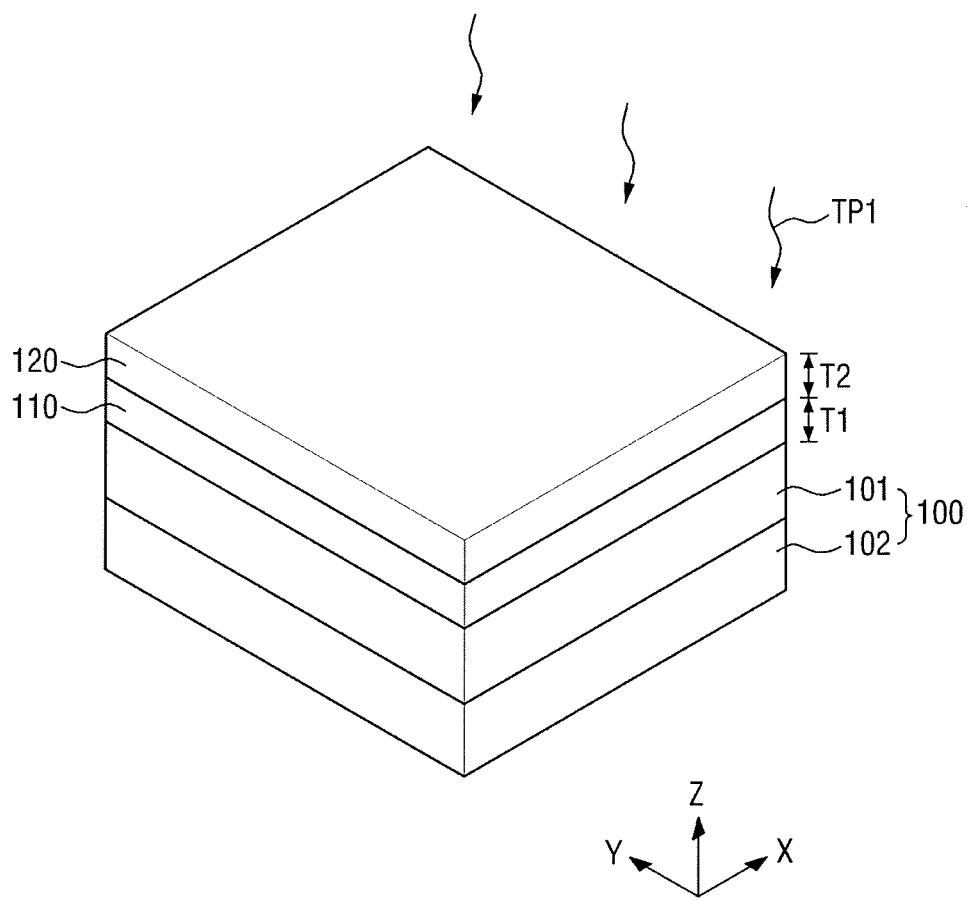

Referring to FIG. 2, a second semiconductor layer 120 is formed on the first semiconductor layer 110. For example, the second semiconductor layer 120 may include Ge.

For example, the thickness of the second semiconductor layer 120 in the third direction Z is a second thickness T2, which may be equal to or greater than the first thickness T1. The present inventive concept is not limited thereto. In addition, the second semiconductor layer 120 may include SiGe, where the concentration ratio of Ge to Si may be referred to as a first concentration. Here, the first concentration may be, for example, about 60%, but the present inventive concept is not limited thereto.

Since the second semiconductor layer 120 includes SiGe and the first semiconductor layer 110 includes Si, a lattice constant of the second semiconductor layer 120 is greater than that of the first semiconductor layer 110. The difference in the lattice constant may create stress which causes defect or dislocation to occur in the second semiconductor layer 120 if the thickness T2 of the semiconductor layer 120 is equal to or greater than a critical thickness of the second semiconductor layer 120. In an exemplary embodiment, the thickness T2 of the second semiconductor layer 120 is controlled to have a thickness smaller than the critical thickness.

A first thermal process TP1 is performed on the first semiconductor layer 110 and the second semiconductor layer 120.

Figure 3:
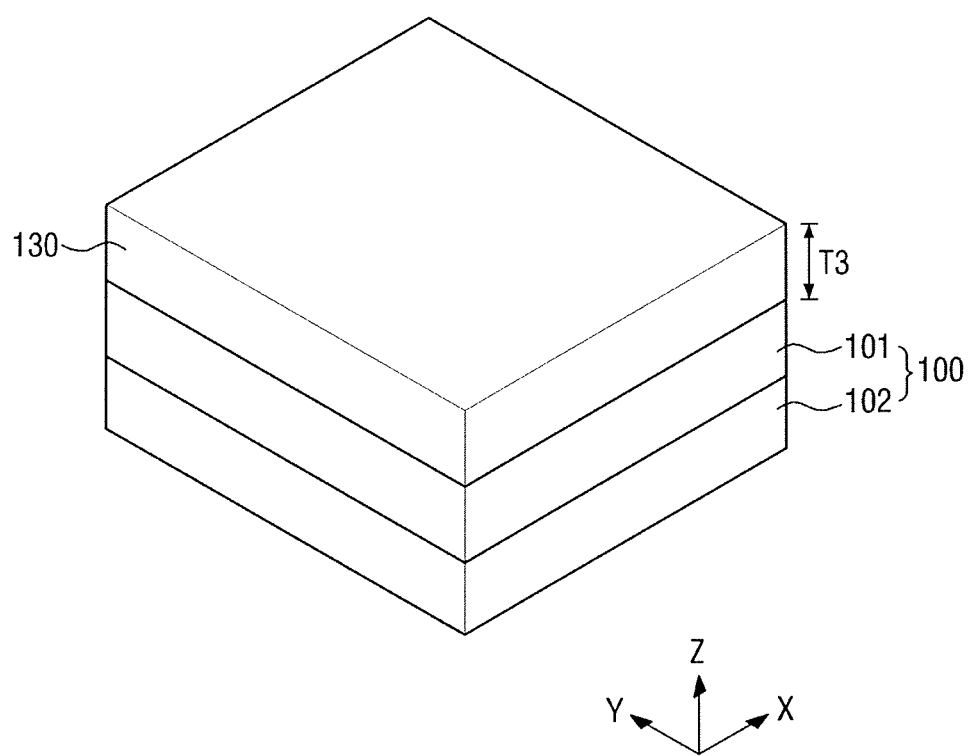

Referring to FIG. 3, a third semiconductor layer 130 is formed as a result of the first thermal process TP1. The third semiconductor layer 130 may include Ge at a second concentration lower than the first concentration. The second concentration may be referred to as a concentration ratio of Ge to Si as the first concentration.

For example, the thickness of the third semiconductor layer 130 in the third direction Z may be a third thickness T3. The third thickness T3 may be equal to a sum of the first and second thicknesses T1 and T2. The term 'equal' used herein may include 'processing error allowance' in the formation of the layers 110, 120 and 130. In addition, the first thermal process TP1 is, for example, an annealing process, but aspects of the present inventive concept are not limited thereto.

For example, the second concentration may be, for example, about 33%, but the present inventive concept is not limited thereto. In addition, the third thickness T3 of the third semiconductor layer 130 may be smaller than the critical thickness. Since the third thickness T3 of the third semiconductor layer 130 is smaller than the critical thickness, there is a reduced occurrence probability of dislocation or defect.

Figure 4:
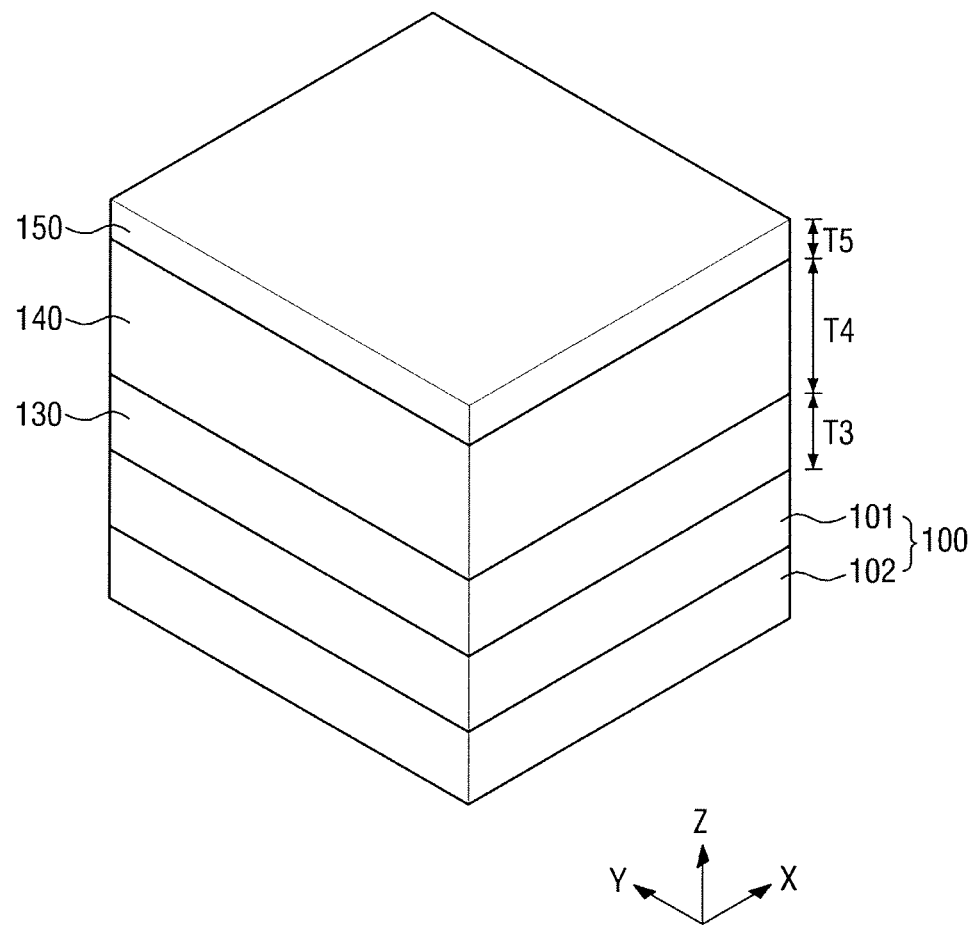

Referring to FIG. 4, fourth and fifth semiconductor layers 140 and 150 respectively including Ge having third and fourth concentrations higher than the second concentration are formed on the third semiconductor layer 130.

For example, a thickness of the fourth semiconductor layer 140 in the third direction Z is a fourth thickness T4, which may be greater than the third thickness T3. In addition, the fourth semiconductor layer 140 may include SiGe, and the concentration ratio of Ge to Si is a third concentration. Here, the third concentration may be, for example, about 45%, but the present inventive concept is not limited thereto.

A thickness of the fifth semiconductor layer 150 in the third direction Z is a fifth thickness T5, which may be smaller than the third thickness T3. In addition, the fifth semiconductor layer 150 may include SiGe, and the concentration ratio of Ge to Si is a fourth concentration. Here, the fifth concentration may be, for example, about 40%, but the present inventive concept is not limited thereto.

Additionally, the fourth thickness T4 and/or the fifth thickness T5 may be smaller than the critical thickness. Since the Ge concentration of the fourth semiconductor layer 140 and the fifth semiconductor layer 150 is not much different with the Ge concentration of the third semiconductor layer 130, less stress due to a difference in the lattice constant may be occur. Accordingly, restriction due to the critical thickness may be reduced and a thickness of a semiconductor layer including SiGe may further be increased with a less occurrence probability of dislocation or defect.

Figure 5:
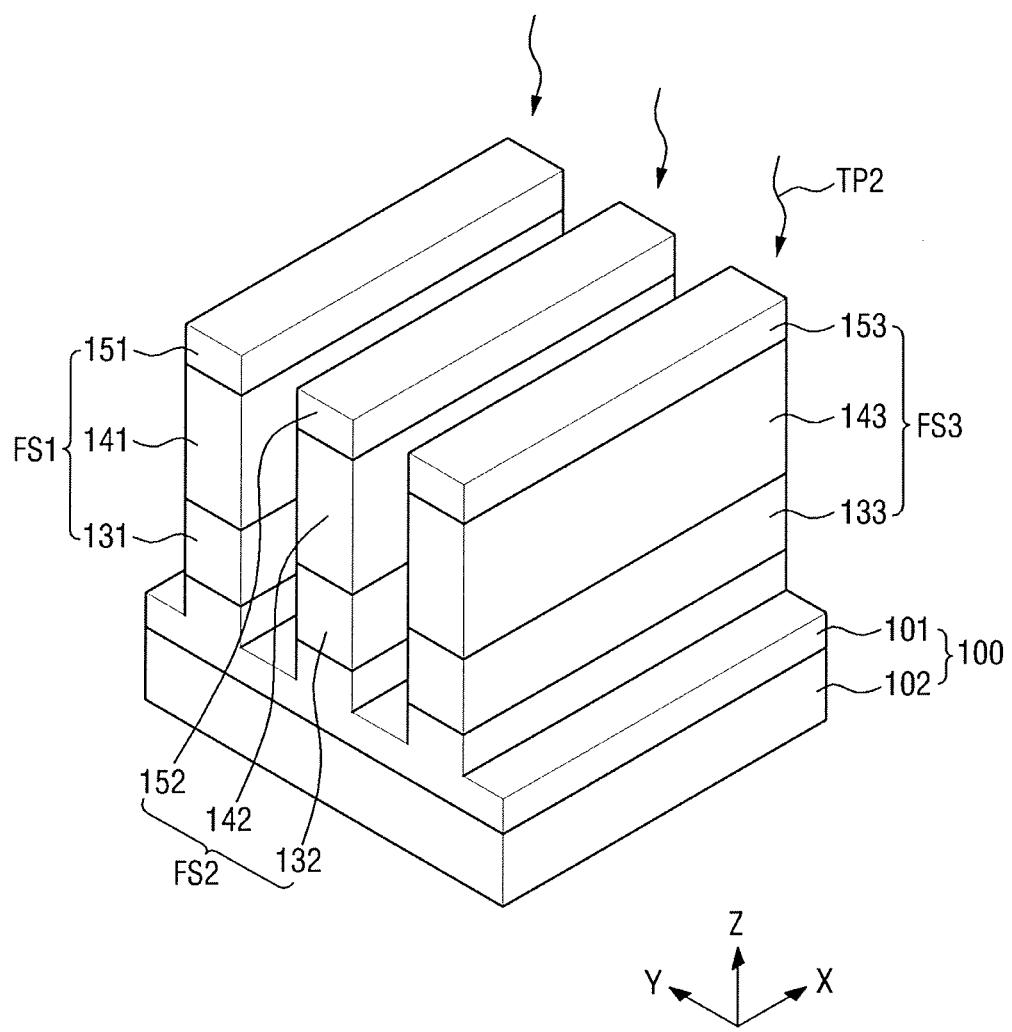

Referring to FIG. 5, a top portion of the upper substrate 101 and the third to fifth semiconductor layers 130 to 150 are patterned to form first to third fin type structures FS1 to FS3 protruding in the third direction Z. For the convenience of description, three fin type structures FS1 to FS3 are shown, but the present inventive concept is not limited thereto.

For example, the first to third fin type structures FS1 to FS3 include portions of the third to fifth semiconductor layers 130 to 150 sequentially stacked and are spaced apart from each other in the second direction Y.

Figure 9:
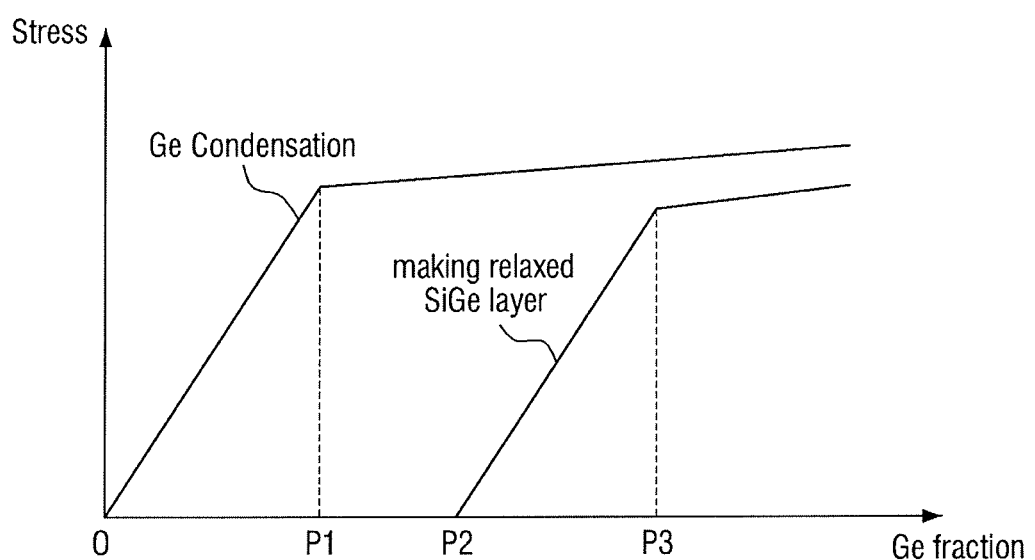
FIG. 9 shows relationships of stress and thickness according to an exemplary embodiment of the present inventive concept.

In addition, a top portion of the upper substrate 101 is patterned to reduce a contact area of the upper substrate 101 with the third semiconductor layer 130. If the resulting structure is exposed to a heat treatment of FIG. 5, which will be describe later, stress of the semiconductor layers 130 to 150 may be accumulated on the upper substrate 101 without being released properly. However, as shown in FIG. 5, if the top portion of the upper substrate 101 is patterned and a heat treatment is, then, applied to the patterned structure of FIG. 5, an area of the upper substrate 101 absorbing the stress applied to the first to third fin type structures FS1 to FS3 is reduced and the stress applied to the first to third fin type structures FS1 to FS3 may be released to form a relaxed SiGe layer, as shown in FIG. 9.

The horizontal width of the patterned top portion of the upper substrate 101 may be substantially the same with that of the first to third fin type structures FS1 to FS3.

A second thermal process TP2 is performed on the first to third fin type structures FS1 to FS3.

Figure 6:
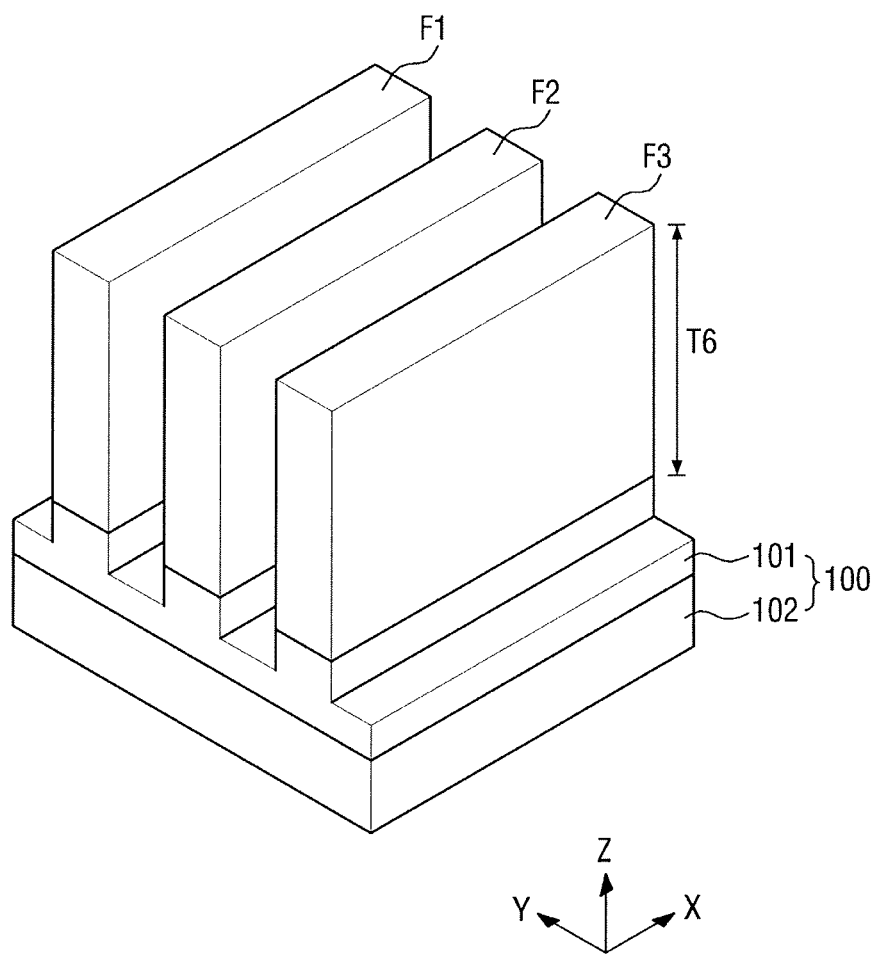

Referring to FIG. 6, first to third fin type active patterns F1 to F3 including Ge are formed as a result of the second thermal process TP2. The first to third fin type active patterns F1 to F3 may have a fifth concentration higher than the second concentration and lower than the third concentration.

For example, a thickness of each of the first to third fin type active patterns F1 to F3 in the third direction Z may be a sixth thickness T6, which may be equal to a sum of the third to fifth thicknesses T3 to T5. The term 'equal' may include 'processing error allowance' in the formation of the first to third fin type active patterns F1 to F3. In addition, the fifth concentration may be, for example, in a range of about 40% to about 60%, but the present inventive concept is not limited thereto. The sixth thickness T6 may be smaller than the critical thickness.

The second thermal process TP2 may be, for example, an annealing process, but the present inventive concept is not limited thereto.

Figure 7:
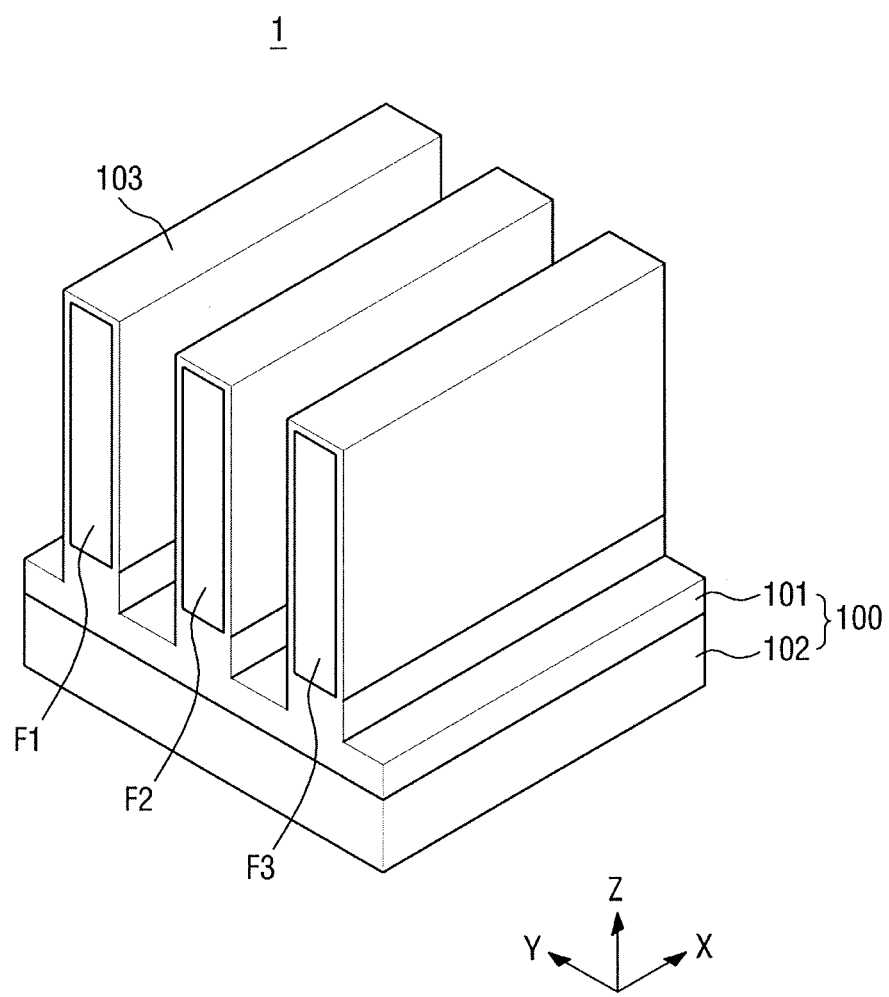

Referring to FIG. 7, an oxidation layer 103 is formed to cover surfaces of the first to third fin type active patterns F1 to F3.

For example, the surfaces of the first to third fin type active patterns F1 to F3 are oxidized to form the oxidation layer 103. Here, the oxidation process may be, for example, a dry oxidation process, but the present inventive concept is not limited thereto. In addition, the oxidation layer 103 may include, for example, $SiO_2$.

In the oxidation process, Si included in the first to third fin type active patterns F1 to F3 may react with O2 so that the surfaces of the first to third fin type active patterns F1 to F3 are oxidized and thus the relative concentration of Ge to Si in the first to third fin type active patterns F1 to F3 may increase. Therefore, the first to third fin type active patterns F1 to F3 include Ge having the sixth concentration higher than the first and fifth concentrations.

Additionally, the sixth concentration may be, for example, about 70%, but the present inventive concept is not limited thereto.

The surfaces of the first to third fin type active patterns F1 to F3 are oxidized to have a relatively high concentration (e.g., about 70%) of Ge in the first to third fin type active patterns F1 to F3 of the semiconductor device 1 according to an exemplary embodiment of the present inventive concept. The stress level of the first to third fin type active patterns F1 to F3 may be controlled to about 1.5 to about 2.5 GPa so that a defect or dislocation is not generated.

Hereinafter, the semiconductor device of FIG. 7 will be described with reference to FIGS. 8 and 9.

Figure 8:
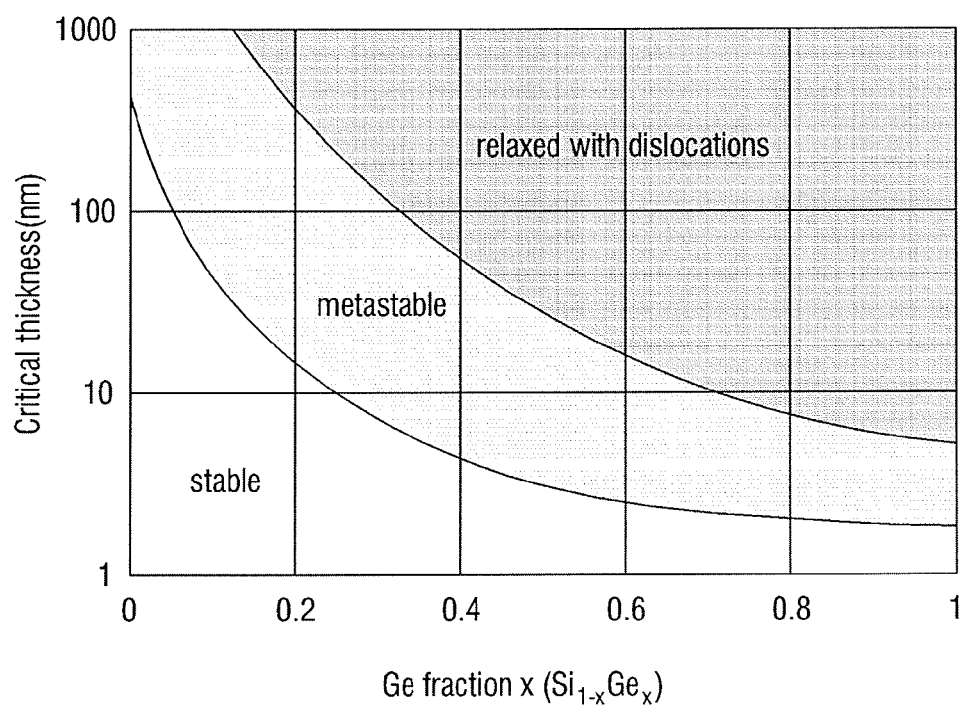
FIG. 8 shows physical properties of SiGe layer according to an exemplary embodiment of the present inventive concept.

Referring to FIG. 8, a critical thickness of a thin film layer having SiGe is shown according to the relative concentration of Ge in SiGe according to an exemplary embodiment of the present inventive concept.

As described above, the critical thickness may refer to as a thickness of a thin film layer having SiGe in which defect or dislocation starts to occur in the thin film layer including SiGe. For example, the defect or dislocation may occur first around the boundary between a metastable state and a relaxed state with dislocations. Therefore, the critical thickness is a thickness around the boundary between a metastable state and a relaxed state at a relative concentration (or fraction) of Ge or a Ge fraction. The critical thickness is reduced as the relative concentration of Ge in SiGe is increased. For example, a Ge condensation process may apply to an SiGe layer having a relatively low concentration without causing a defect or dislocation. In the Ge condensation process, at least one heat treatment may apply to the SiGe layer. However, if a Ge condensation process applies to an SiGe layer having a relatively high Ge concentration, there may be an increased probability of the SiGe layer having defect or dislocation if the thickness of the SiGe layer having a relatively high Ge concentration is thinner than that of the SiGe layer having a relatively low Ge concentration.

Referring to FIG. 9, in the method of fabricating the semiconductor device 1 according to an exemplary embodiment of the present inventive concept, a third semiconductor layer 130 having a third thickness T3 smaller than the critical thickness and including Ge at a third concentration is formed using a first semiconductor layer 110 including Si and a second semiconductor layer 120 including Ge at a first concentration. In this case, it is possible to prevent excess stress from accumulating due to a difference in the lattice constant.

In addition, since the fourth and fifth semiconductor layers 140 and 150 formed on the third semiconductor layer 130 include Ge at fourth and fifth concentrations, a slight increase in the critical thickness can be facilitated. Here, there is no significant difference among the third, the fourth and fifth concentrations. Additionally, the upper substrate 101 and the third to fifth semiconductor layers 130 to 150 are patterned before being thermally processed and oxidized, to relax the stress applied to the third to fifth semiconductor layers including SiGe.

Consequently, in general Ge condensation, a defect or dislocation may start to occur from P1. By contrast, in the method for fabricating the semiconductor according to an embodiment of the present inventive concept, a defect or dislocation may start to occur from P3. For example, the method for fabricating the semiconductor according to an exemplary embodiment of the present inventive concept employs a process of making a relaxed SiGe layer to slow-down the occurrence of the defect or dislocation by P3 in proportion as Ge fraction increases.

Hereinafter, an exemplary method for forming a transistor including a semiconductor device according to an exemplary embodiment of the present inventive concept will be described with reference to FIGS. 10 to 17.

FIGS. 10 to 17 illustrate intermediate process steps of forming a transistor including a semiconductor device according to an exemplary embodiment of the present inventive concept.

Figure 10:
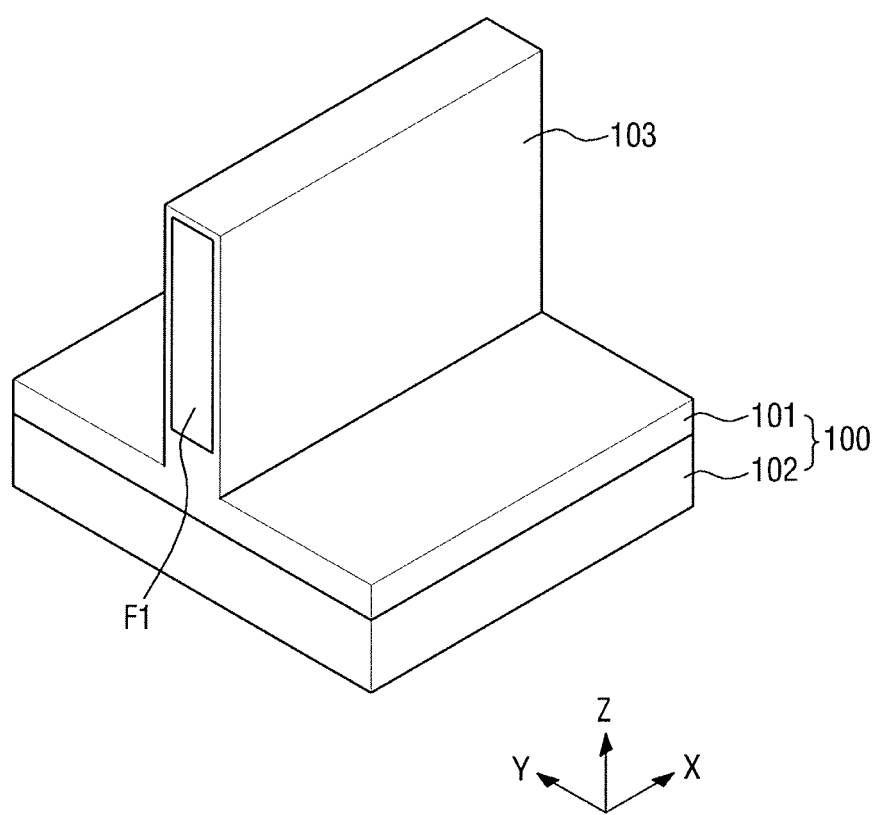
FIGS. 10 to 17 illustrate intermediate process steps in a method for forming an exemplary transistor including a semiconductor device according to an exemplary embodiment of the present inventive concept.

FIG. 10 is a perspective view illustrating one of fin type active patterns shown in FIG. 7 (e.g., a first fin type active pattern F1). The following description will be made with reference to FIG. 10.

Figure 11:
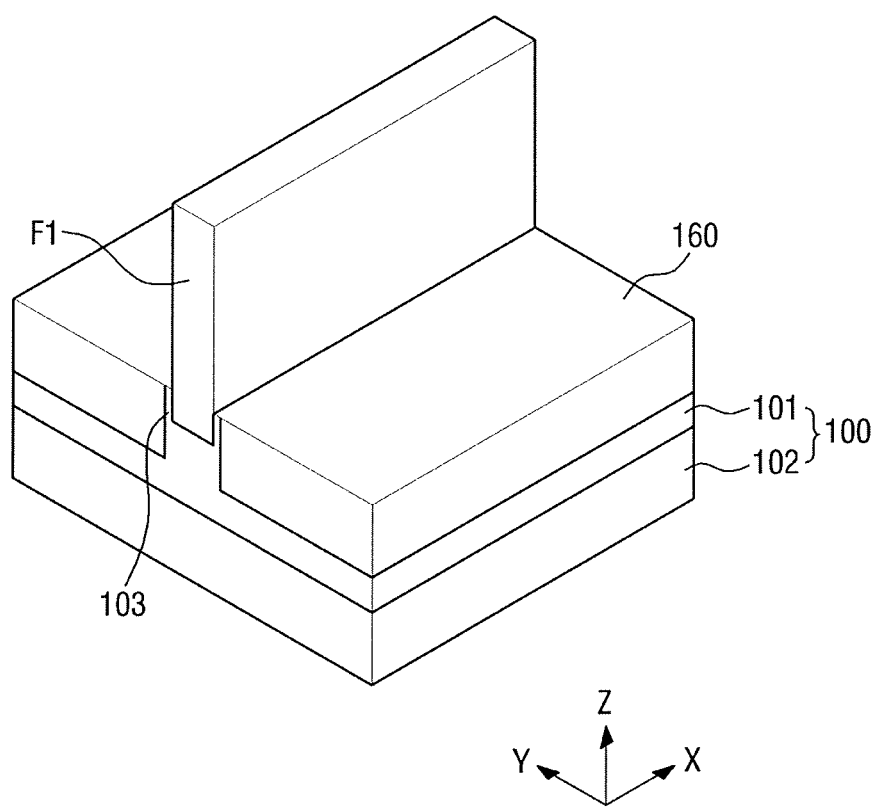

Before describing FIGS. 12 to 17, referring first to FIG. 11, a field insulation layer 160 is formed on a substrate 100. The field insulation layer 160 may include, for example, at least one of a silicon oxidation layer, a silicon nitride layer, and a silicon oxynitride layer.

For example, the field insulation layer 160 covering an upper substrate 101 of the substrate 100 is formed. Through a planarization process, the top surface of the first fin type active pattern F1 and a top surface of the field insulation layer 160 may be at substantially the same height from the substrate 100. The top surface of the first fin type active pattern F1 may be exposed.

Next, a portion of the field insulation layer 160 is recessed, as shown in FIG. 11. As the result, the first fin type active pattern F1 may protrude above the top surface of the recessed field insulation layer 160. For example, the recessed field insulation layer 160 covers lower sidewalls of the first fin type active pattern F1, being in contact with an oxidation layer 103.

Next, an exemplary method of forming a transistor will be described with reference to FIGS. 12 to 17. In this case, the field insulation layer 160 of FIG. 11 is not provided as shown in FIG. 10. The same process steps as described below with reference to FIGS. 12 to 17 are also applied to the exemplary embodiment of FIG. 11, and for the convenience of description, detailed descriptions thereof will not be given.

Figure 12:
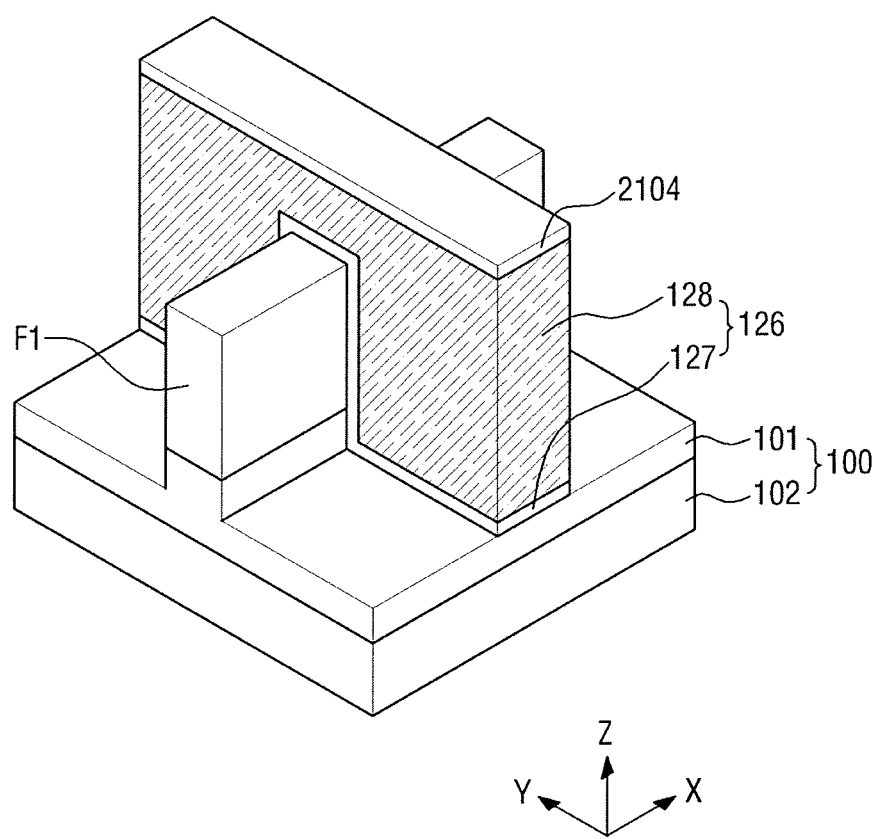

Referring to FIG. 12, an etching process is performed using a mask pattern 2104 to form a dummy gate pattern 126 extending in a second direction Y across the first fin type active pattern F1.

The dummy gate pattern 126 is formed on the first fin type active pattern F1. The dummy gate pattern 126 overlaps a portion of the first fin type active pattern F1. The first fin type active pattern F1 includes a portion covered by the dummy gate pattern 126 and a portion exposed by the dummy gate pattern 126.

The dummy gate pattern 126 includes a dummy gate insulation layer 127 and a dummy gate electrode 128. For example, the dummy gate insulation layer 127 may be a silicon oxidation layer and the dummy gate electrode 128 may include polysilicon.

Figure 13:
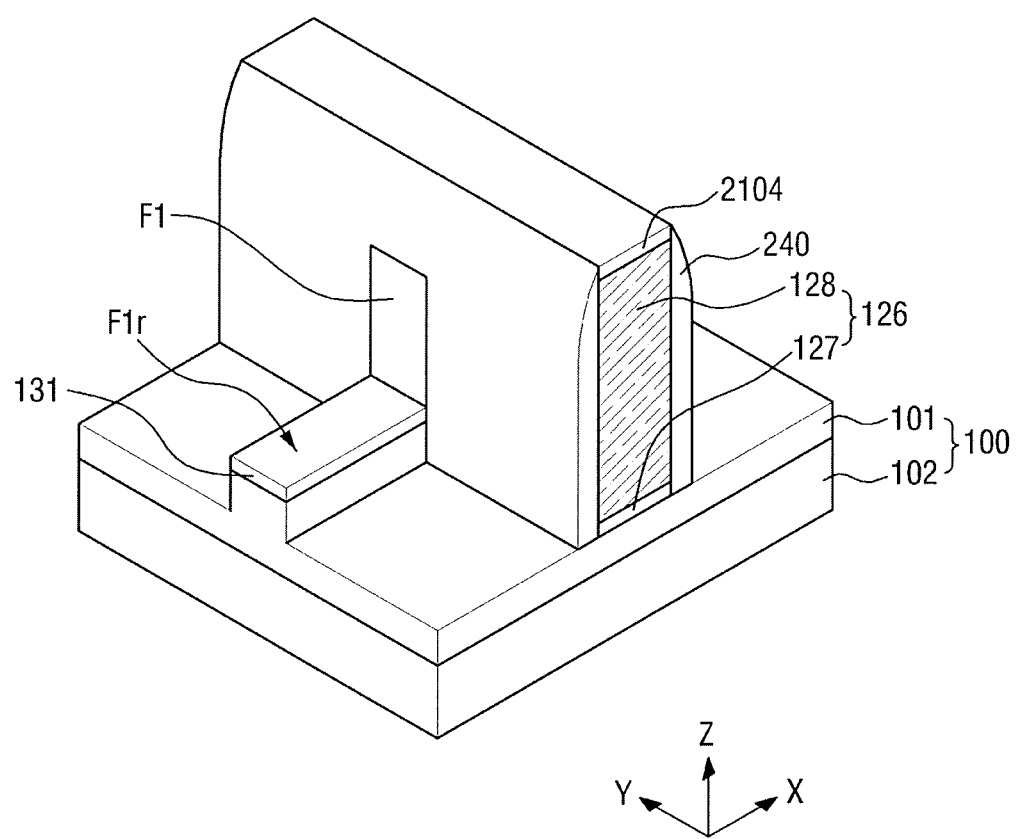

Referring to FIG. 13, a spacer 240 is formed on a lateral surface of the dummy gate pattern 126. For example, the spacer 240 is formed on lateral surfaces of the dummy gate insulation layer 127 and the dummy gate electrode 128.

To form the spacer 240, an insulation layer may be formed on the resultant structure of FIG. 12 having the dummy gate pattern 126, followed by performing an etch back process to form the spacer 240. The spacer 240 exposes a top surface of the mask pattern 2104 and a top surface of the first fin type active pattern F1 not overlapping with the dummy gate pattern 126. The spacer 240 may be, for example, a silicon nitride layer or a silicon oxynitride layer.

Next, portions of the first fin type active pattern F1 exposed at opposite sides of the dummy gate pattern 126 are partially removed to form a recessed region F1r in the first fin type active pattern F1.

While forming the recess region F1r, the portions of the first fin type active pattern F1 remain on the upper substrate 101 which is not covered with the spacer 240 and the dummy gate pattern 126, serving as an epitaxial seed layer 131. The present inventive concept is not limited thereto. For example, the first fin type active pattern F1 making contact with the upper substrate 101 may be completely removed to expose a top surface of the upper substrate 101. In this case, the epitaxial seed layer 131 does not exist.

The first fin type active pattern F1 formed on the upper substrate 101 is exposed through lateral surfaces of the recess region F1r.

Figure 14:
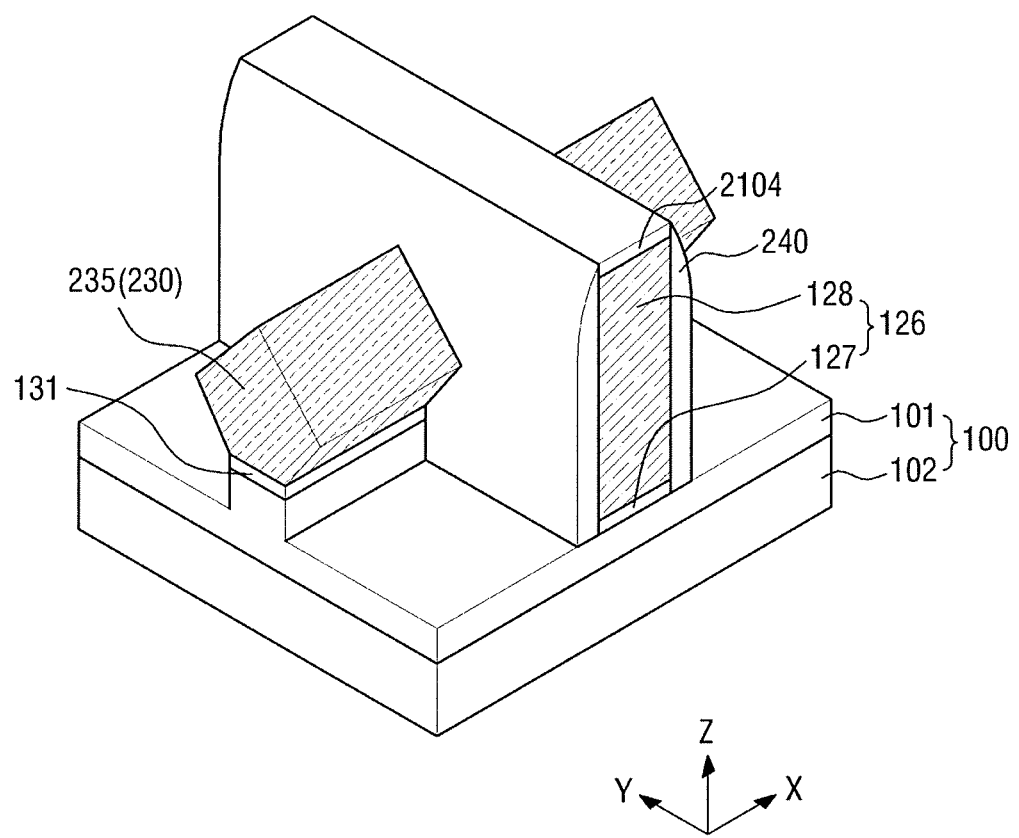

Referring to FIG. 14, a first epitaxial layer 235 filling the recess region F1r is formed on the first fin type active pattern F1. For example, first source/drain regions 230 are formed at opposite sides of the dummy gate electrode 128.

The first epitaxial layer 235 may be formed by epitaxial growth. The first epitaxial layer 235 may be grown on the epitaxial seed layer 131 and the lateral surfaces of the dummy gate pattern 126 exposed by the recess region F1r. If the epitaxial seed layer 131 is not provided, the first epitaxial layer 235 may grow using as a seed layer the first fin type active pattern F1 exposed by the lateral surfaces of the recess region F1r.

An outer circumferential surface of the first epitaxial layer 235 may have various shapes. For example, the outer circumferential surface of the first epitaxial layer 235 may be at least one shape of a diamond, a circle and a rectangle. For example, in FIG. 14, the first epitaxial layer 235 has a diamond shape (or a pentagonal or hexagonal shape). The present inventive concept is not limited thereto. Various shapes may be formed by adjusting epitaxial processing conditions in forming the first epitaxial layer 235.

In addition, if the transistor is a P-type Metal Oxide Semiconductor (PMOS) transistor, the first source/drain region 230 may include a compressive stress material. For example, the compressive stress material may be a material having a larger lattice constant than silicon (Si), for example, SiGe. The compressive stress material may increase the mobility of carriers of a channel region by applying the compressive stress to the first fin type active pattern F1.

However, if the transistor is an N-type Metal Oxide Semiconductor (NMOS) transistor, the first source/drain region 230 may include the same material as the substrate 100 or a tensile stress material. For example, when the substrate 100 includes Si, the first source/drain region 230 may include Si or a material having a smaller lattice constant than Si (e.g., SiC).

Here, the first source/drain region 230 may be formed using an epitaxial process, as described above. In the epitaxial process, impurity may be in situ doped.

Figure 15:
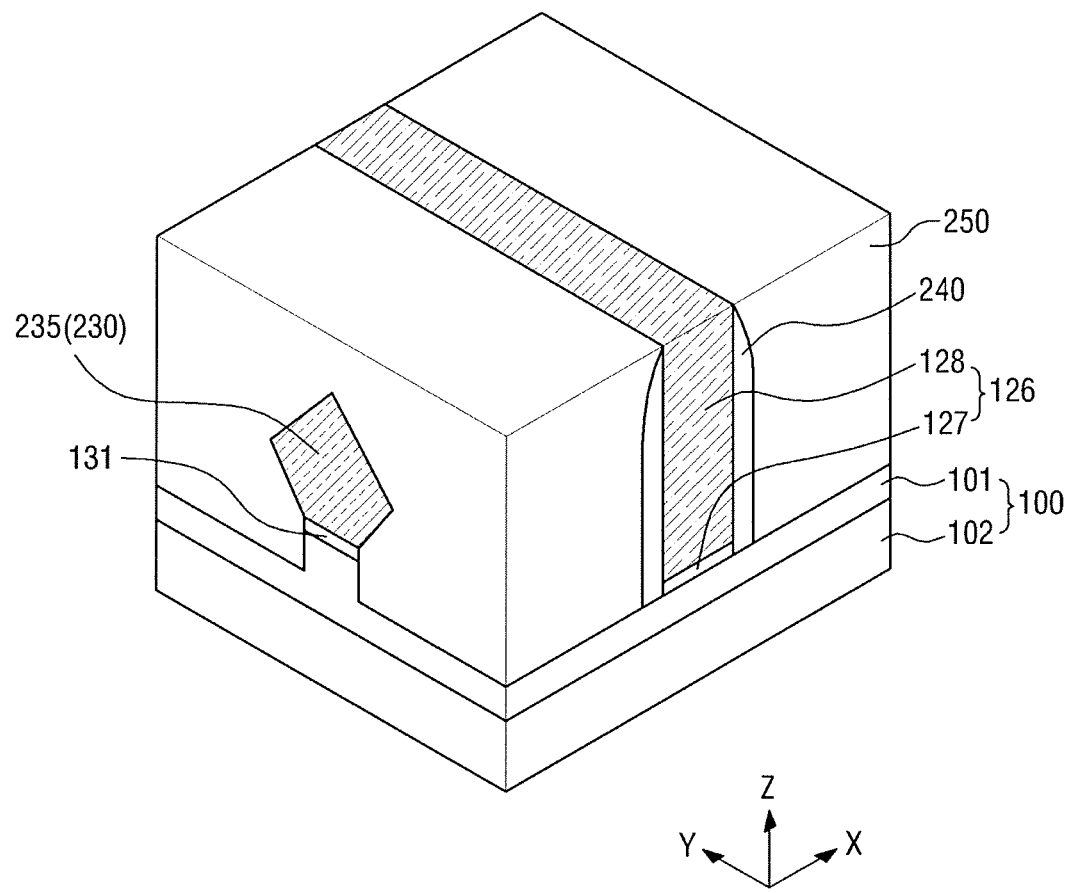

Referring to FIG. 15, an interlayer insulation layer 250 is formed on the resultant structure of FIG. 14 having the first source/drain region 230. The interlayer insulation layer 250 may include, at least one of an oxidation layer, a nitride layer and an oxynitride layer.

An insulation layer may be formed on the resulting structure of FIG. 14, and then the insulation layer may be planarized until a top surface of the dummy gate pattern 126 is exposed to form the interlayer insulation layer 250. As the result, the mask pattern 2104 is removed, and the top surface of the dummy gate pattern 126 is exposed.

Figure 16:
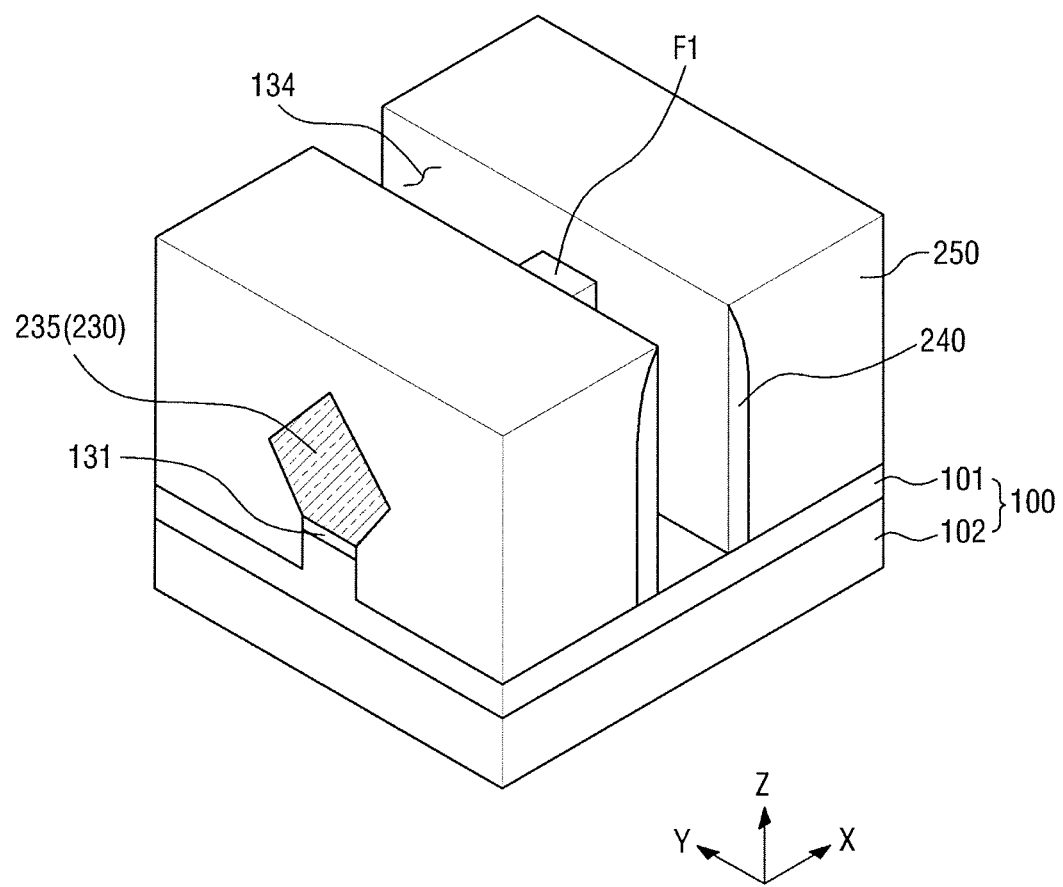

Referring to FIG. 16, the dummy gate pattern 126 having the dummy gate insulation layer 127 and the dummy gate electrode 128 is removed to form a trench 134. The trench 134 exposes portions of the upper substrate 101 and the first fin type active pattern F1.

Figure 17:
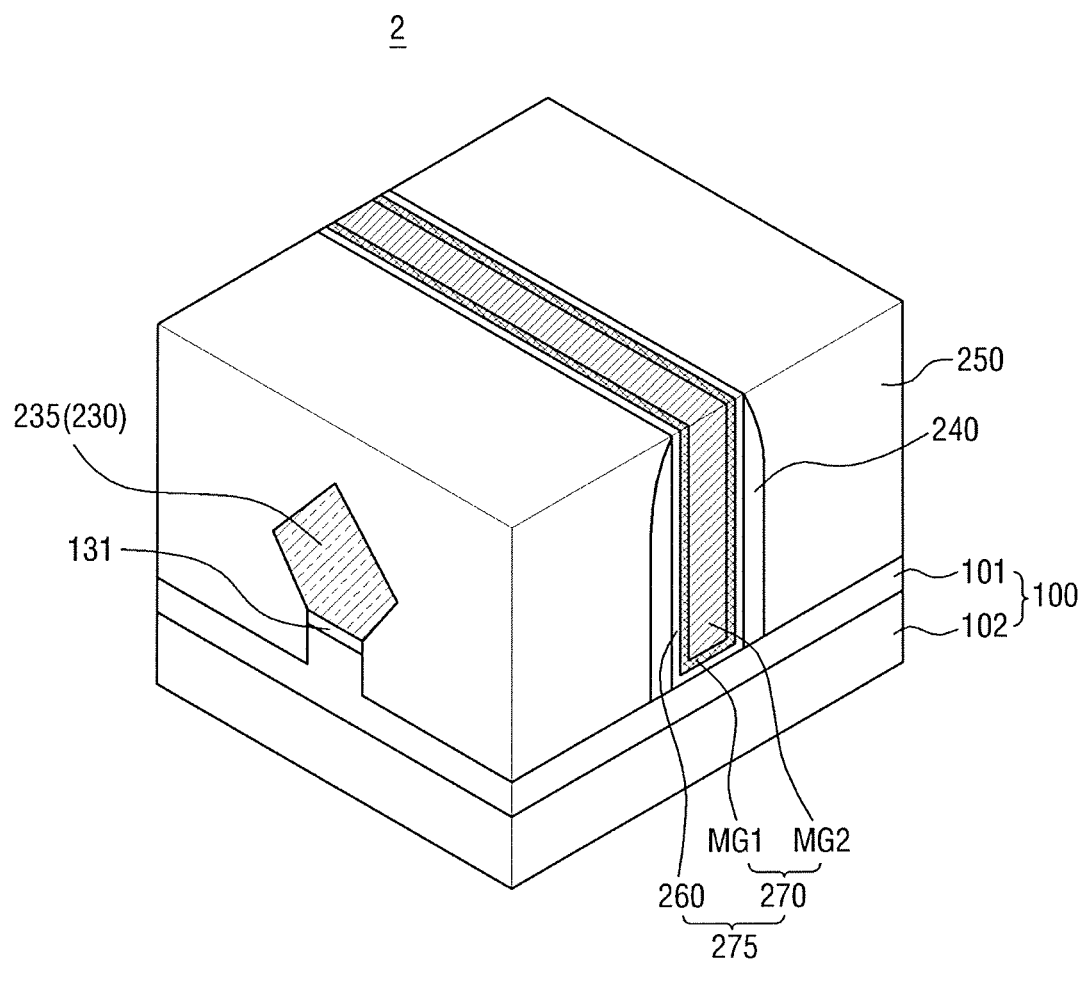

Referring to FIG. 17, a gate insulation layer 260 and a gate electrode 270 are formed in the trench 134 to form a gate pattern 275.

The gate insulation layer 260 may be conformally formed along sidewalls and a bottom surface of the trench 134. The gate insulation layer 260 may include a high-k material having a higher dielectric constant than a silicon oxidation layer. The gate insulation layer 260 may include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but the present inventive concept is not limited thereto.

The gate electrode 270 includes metal layers MG1 and MG2. For example, the gate electrode 270 may be formed by stacking two or more metal layers MG1 and MG2. The first metal layer MG1 may function to adjust a work function, and the second metal layer MG2 may function to fill a space formed by the first metal layer MG1. For example, the first metal layer MG1 may include at least one of TiN, TaN, TiC, and TaC. In addition, the second metal layer MG2 may include W or Al. In addition, the gate electrode 270 may include a non-metal, such as Si or SiGe. The gate electrode 270 may be formed by, for example, using a replacement process, but the present inventive concept is not limited thereto.

The gate pattern 275, as shown in FIG. 17, is formed in the trench 134 to form an exemplary transistor 2. including the semiconductor device 1 shown in FIG. 7.

Hereinafter, a method of forming a transistor including a semiconductor device according to an exemplary embodiment of the present inventive concept will be described with reference to FIGS. 18 to 22. The same process steps as described above with reference to FIGS. 10 and 12 are also applied to this embodiment, and detailed descriptions thereof will not be given.

FIGS. 18 to 22 illustrate intermediate process steps in another exemplary method for forming a transistor including a semiconductor device according to an embodiment of the present inventive concept.

Figure 18:
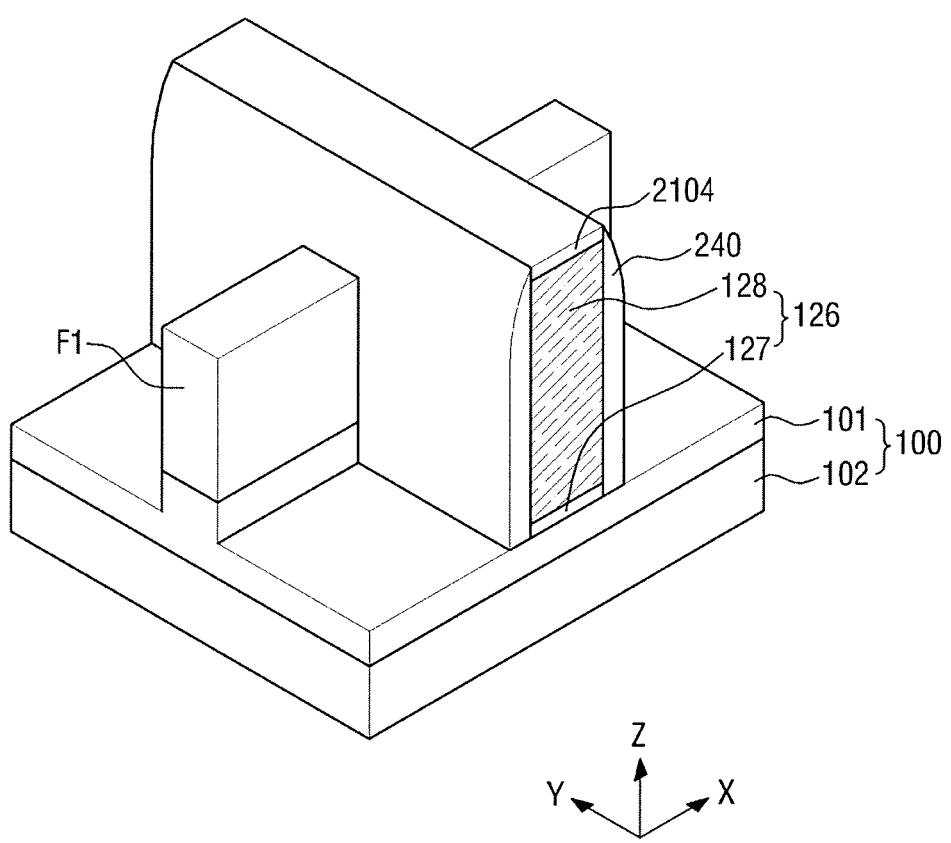
FIGS. 18 to 22 illustrate intermediate process steps in a method for forming another exemplary transistor including a semiconductor device according to an exemplary embodiment of the present inventive concept.

Referring to FIG. 18, as shown in FIG. 12, a field insulation layer 160 need not be formed. Alternatively, the field insulation layer 160 may be formed on the substrate 100, as shown in FIG. 11. In this case, the same process steps as described below with reference to FIGS. 18 to 22 may be applied to the exemplary embodiment of FIG. 11, and detailed descriptions thereof will not be given.

Referring to FIG. 18, a spacer 240 is formed on sidewalls of the dummy gate pattern 126. However, in the forming of the spacer 240, the first fin type active pattern F1 not overlapping with the dummy gate pattern 126 remains unetched.

For example, while forming the spacer 240, a fin spacer (not shown) may also be formed on sidewalls of the first fin type active pattern F1. However, etch-back processing conditions for forming the spacer 240 may be adjusted to prevent the first fin type active pattern F1 from being etched. For example, only the fin spacer (not shown) may be etched.

For example, an etchant material having etching selectivity with respect to first fin type active pattern F1 may be used to etch only materials forming the spacer 240 and the fin spacer (not shown) without etching the first fin type active pattern F1.

Figure 19:
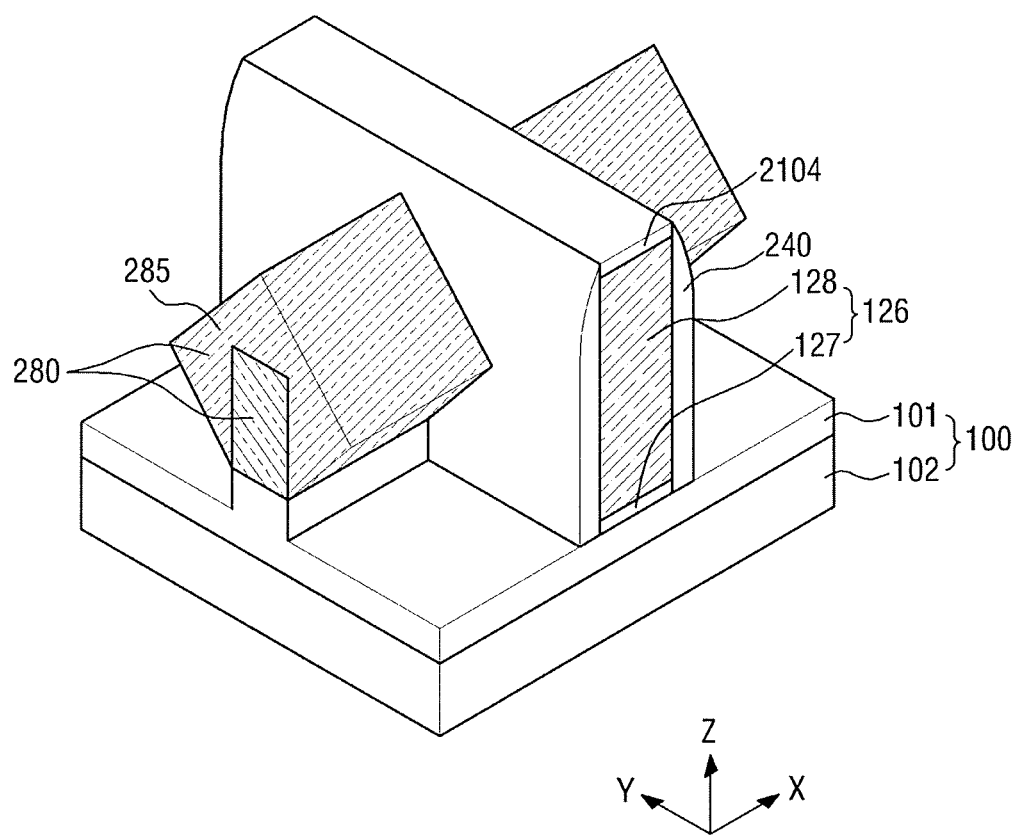

Referring to FIG. 19, a second epitaxial layer 285 is formed at opposite sides of the dummy gate pattern 126.

The second epitaxial layer 285 is formed on the sidewalls and the top surface of the first fin type active pattern F1. For example, the second epitaxial layer 285 is formed along the periphery of the first fin type active pattern F1 protruding above the upper substrate 101.

Accordingly, a second source/drain 280 including the second epitaxial layer 285 and an impurity region formed in the first fin type active pattern F1 is formed.

The second epitaxial layer 285 may be formed by epitaxial growth. The second epitaxial layer 285 may be subjected to the epitaxial growth using the first fin type active pattern F1 as a seed layer.

An outer circumferential surface of the second epitaxial layer 285 may have various shapes. For example, the outer circumferential surface of the second epitaxial layer 285 may be at least one shape of a diamond, a circle and a rectangle. For example, in FIG. 14, the second epitaxial layer 285 has a diamond shape (or a pentagonal or hexagonal shape), but the present inventive concept is not limited thereto. Various shapes may be formed by adjusting epitaxial processing conditions in forming the second epitaxial layer 285.

In addition, if the transistor is a PMOS transistor, the second source/drain 280 may include a compressive stress material. For example, the compressive stress material may be a material having a larger lattice constant than silicon (Si), for example, SiGe. The compressive stress material may increase the mobility of carriers of a channel region by applying the compressive stress to the first fin type active pattern F1.

However, if the transistor is an NMOS transistor, the second source/drain 280 may include the same material as the substrate 100 or a tensile stress material. For example, when the substrate 100 includes Si, the second source/drain 280 may include Si or a material having a smaller lattice constant than Si (e.g., SiC).

Here, the forming of the second source/drain 280 may be performed by an epitaxial process, as described above. However, in the epitaxial process, impurity may be in situ doped.

Figure 20:
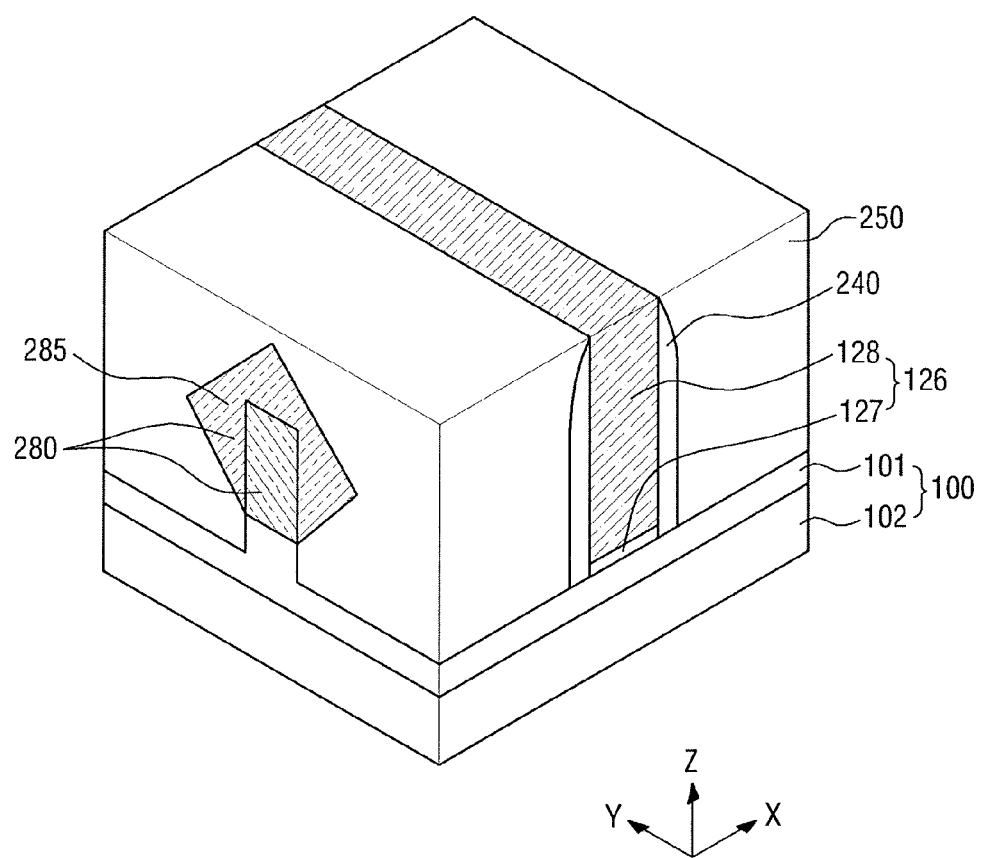

Referring to FIG. 20, an interlayer insulation layer 250 is formed on the resultant structure of FIG. 19 having the second source/drain 280. The interlayer insulation layer 250 may include, at least one of an oxidation layer, a nitride layer and an oxynitride layer.

For example, an insulating layer may be formed on the resultant structure of FIG. 19, and the insulating layer may be planarized until a top surface of the dummy gate pattern 126 is exposed to form the interlayer insulation layer 250. As the result, the mask pattern 2104 is removed, and the top surface of the dummy gate pattern 126 is exposed.

Figure 21:
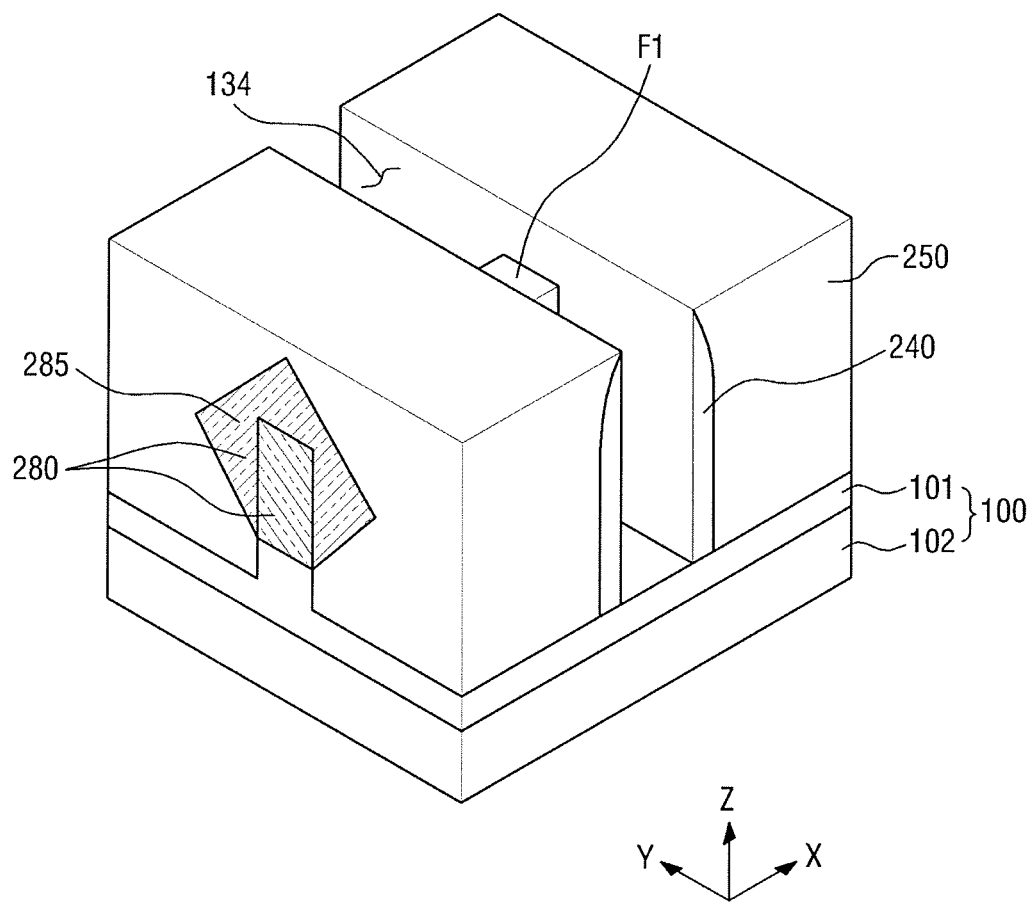

Referring to FIG. 21, the dummy gate pattern 126 including the dummy gate insulation layer 127 and the dummy gate electrode 128, is removed to form a trench 134. The trench 134 exposes portions of the upper substrate 101 and the first fin type active pattern F1.

Figure 22:
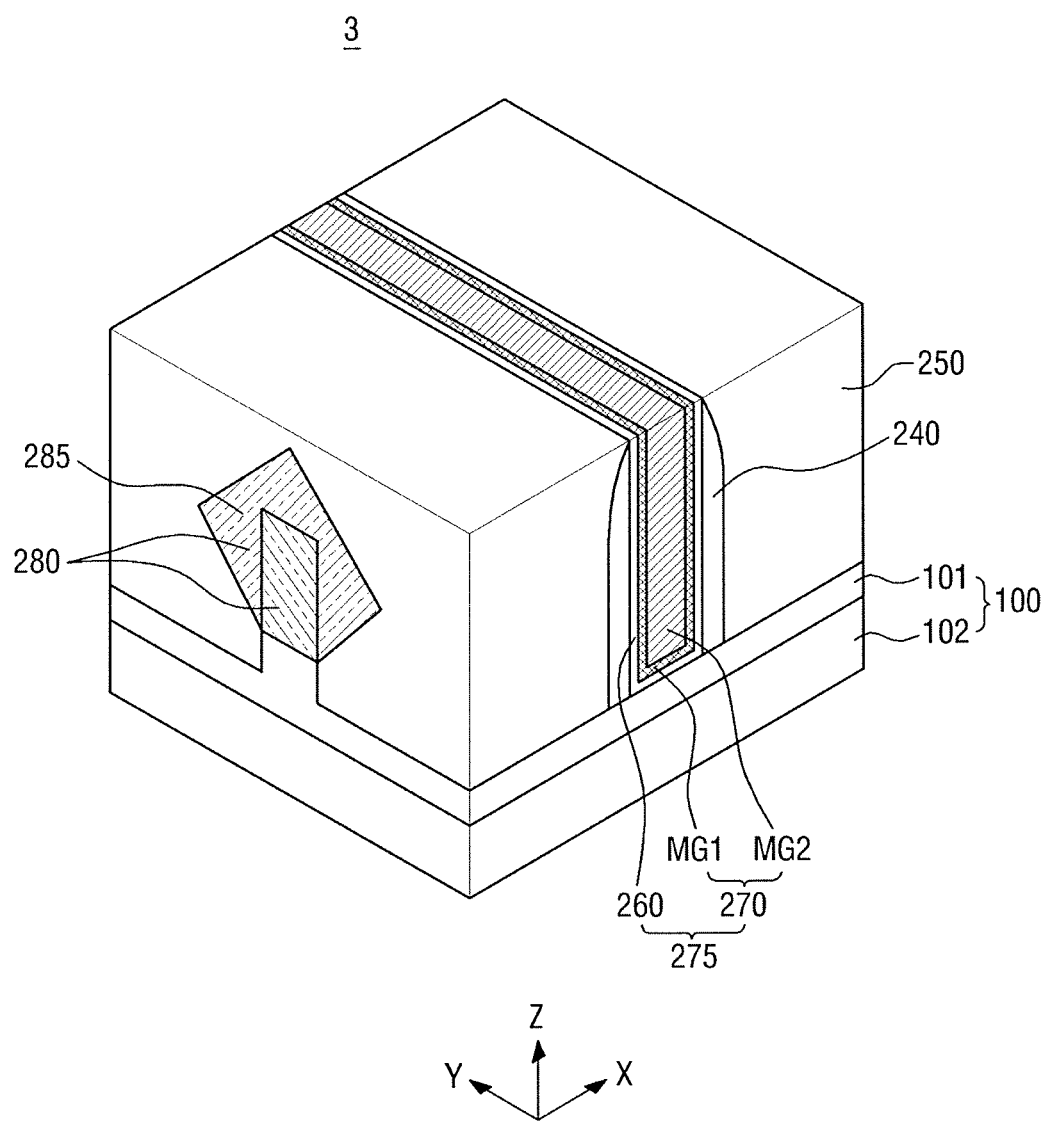

Referring to FIG. 22, a gate insulation layer 260 and a gate electrode 270 are formed in the trench 134 to form a gate pattern 275.

The gate insulation layer 260 may be conformally formed along sidewalls and a bottom surface of the trench 134. The gate insulation layer 260 may include a high-k material having a higher dielectric constant than a silicon oxidation layer. The gate insulation layer 260 may include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but the present inventive concept is not limited thereto.

The gate electrode 270 includes metal layers MG1 and MG2. As shown, the gate electrode 270 is formed by stacking two or more metal layers MG1 and MG2. The first metal layer MG1 may function to adjust a work function, and the second metal layer MG2 may function to fill a space formed by the first metal layer MG1. For example, the first metal layer MG1 may include at least one of TiN, TaN, TiC, and TaC. In addition, the second metal layer MG2 may include W or Al. In addition, the gate electrode 270 may include a non-metal, such as Si or SiGe. The gate electrode 270 may be formed by, for example, a replacement process, but the present inventive concept is not limited thereto.

The gate pattern 275, as shown in FIG. 22, is formed in the trench 134 to fabricate a transistor 3.

Figure 23:
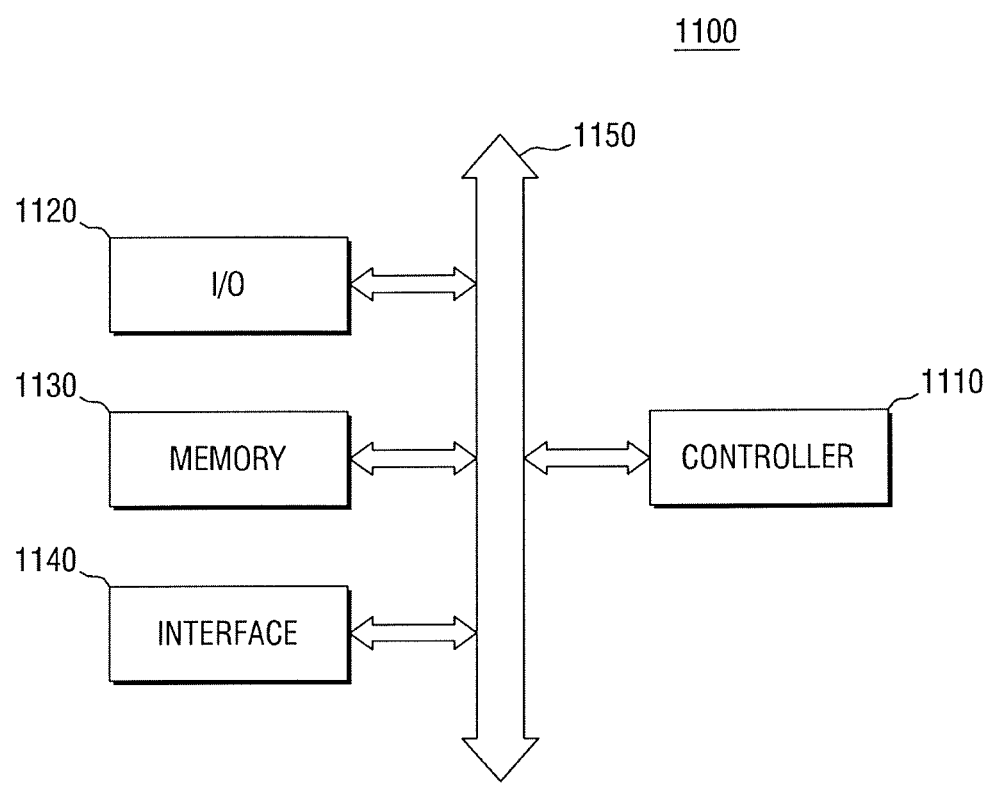
FIG. 23 is a block diagram of an electronic system including a semiconductor device according to an exemplary embodiment of the present inventive concept.

FIG. 23 is a block diagram of an electronic system including a semiconductor device according to an exemplary embodiment of the present inventive concept.

Referring to FIG. 23, the electronic system 1100 includes a controller 1110, an input/output device (I/O) 1120, a memory device 1130, an interface 1140 and a bus 1150. The controller 1110, the I/O 1120, the memory device 1130, and/or the interface 1140 are connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed dynamic random access memory (DRAM) and/or static random access memory (SRAM) as the working memory for the operation of the controller 1110.

Here, a semiconductor device according to an exemplary embodiment of the present inventive concept may be used as the working memory.

A semiconductor device according to an exemplary embodiment of the present inventive concept may be provided in the memory 1130 or may be provided as some components of the controller 1110, the I/O 1120, or the like.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 24:
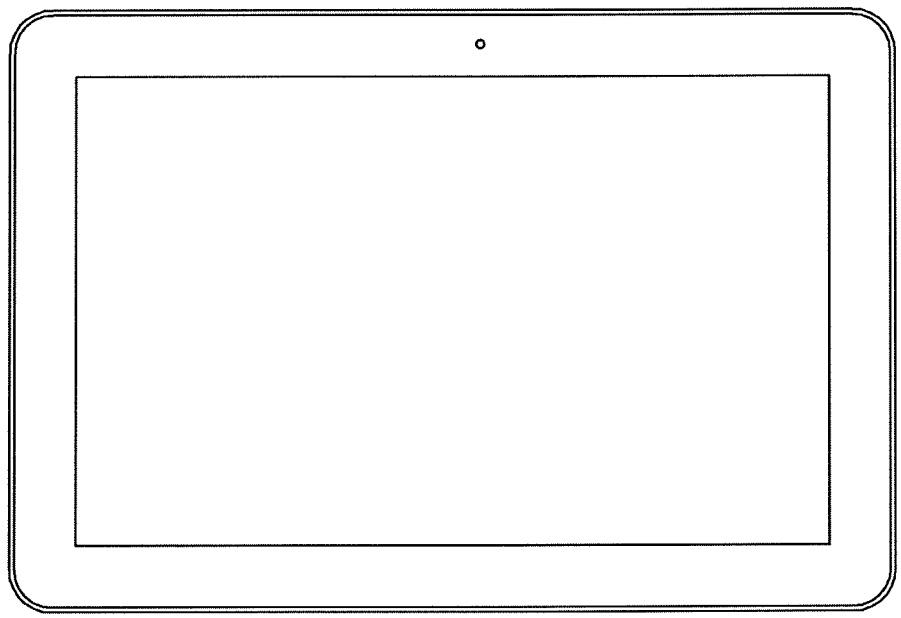
FIGS. 24 to 26 illustrate an exemplary semiconductor system to which a semiconductor device according to an exemplary embodiment of the present inventive concept.
Figure 25:
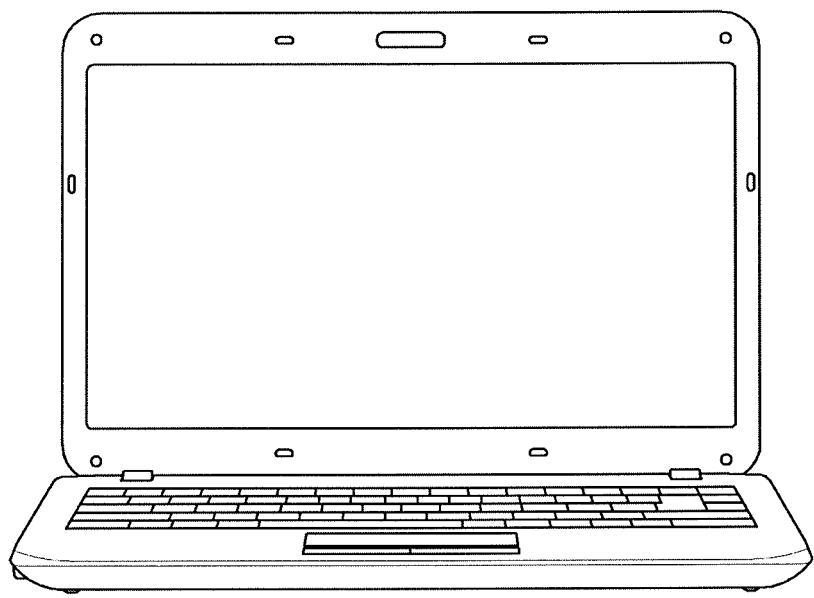
Figure 26:
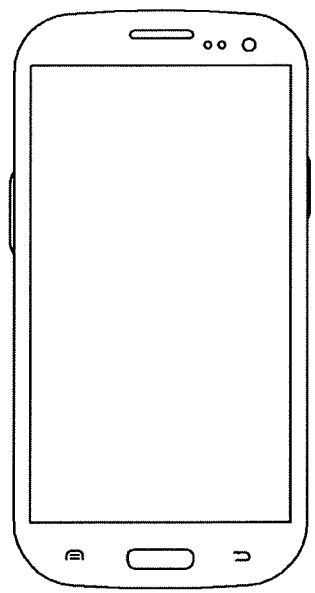

FIGS. 24 to 26 illustrate electronic systems including a semiconductor device according to an exemplary embodiment of the present inventive concept.

Referring to FIG. 24, an electronic system including a semiconductor device according to an exemplary embodiment of the present inventive concept is applied to a tablet PC (1200), FIG. 25 illustrates an example in which a semiconductor device according to an embodiment of the present inventive concept is applied to a notebook computer (1300), and FIG. 26 illustrates an example in which a semiconductor device according to an embodiment of the present inventive concept is applied to a smart phone (1400). The semiconductor device 1 according to an embodiment of the present inventive concept is applied to the tablet PC 1200, the notebook computer 1300 and the smart phone 1400.

In addition, it is obvious to one skilled in the art that the semiconductor device 1 according to an embodiment of the present inventive concept may also be applied to other IC devices not illustrated herein. At least one of the semiconductor devices according to some embodiments of the present inventive concept can be employed to a tablet PC (1200), a notebook computer (1300), a smart phone (1400), and the like, but not limited thereto. In some embodiments of the present inventive concept, the semiconductor system is implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, or a digital video player.

While the present inventive concept has been particularly shown and described with reference to exemplary embodiments thereof, it will be understood by those of ordinary skill in the art that various changes in form and details is made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor device, the method comprising:
   forming a first semiconductor layer including Ge at a first concentration on an insulation layer;
   sequentially forming second and third semiconductor layers including Ge at second and third concentrations higher than the first concentration on the first semiconductor layer;
   forming a fin type structure by patterning the insulation layer and the first to third semiconductor layers, wherein the fin type structure is vertically protruded; and
   forming a preliminary fin type active pattern including Ge at a fourth concentration higher than the first concentration and lower than the second concentration by performing a first thermal process on the fin type structure.

2. The method of claim 1, wherein the first to third semiconductor layers further include Si, wherein the first to fourth concentrations are relative concentrations of Ge to Si.

3. The method of claim 1, wherein the forming of the first semiconductor layer comprises:
   forming a fourth semiconductor layer different from the first to third semiconductor layers on the insulation layer;
   forming a fifth semiconductor layer including Ge at a fifth concentration higher than the first to fourth concentration on the fourth semiconductor layer; and
   forming the first semiconductor layer by performing a second thermal process on the fourth and fifth semiconductor layers.

4. The method of claim 3, wherein the fourth semiconductor layer includes Si without including Ge.

5. The method of claim 4, wherein the fifth semiconductor layer further includes Si, wherein the fifth concentration is a relative concentration of Ge to Si.

6. The method of claim 1, wherein the third concentration is higher than the first concentration and lower than the second concentration.

7. The method of claim 1, wherein the fourth concentration of Ge is in a range of about 40% to about 60%.

8. The method of claim 1, wherein a vertical thickness of the first semiconductor layer is smaller than that of the second semiconductor layer and is greater than that of the third semiconductor layer.

9. The method of claim 8, wherein a vertical thickness of each of the first to third semiconductor layers is smaller than a critical thickness at which dislocation occurs.

10. The method of claim 9, wherein the critical thickness decreases as the concentration of Ge increases.

11. The method of claim 1, wherein the patterning of the insulation layer comprises patterning partially a top portion of the insulation layer, and a horizontal width of the top portion of the patterned insulation layer is substantially equal to that of the fin type structure.

12. The method of claim 1, further comprising:
   forming a fin type active pattern by oxidizing the preliminary fin type active pattern, wherein the fin type active pattern includes Ge at a sixth concentration higher than the second concentration.

13. The method of claim 12, wherein the sixth concentration is higher than the first concentration.

14. A method of fabricating a semiconductor device, the method comprising:
   forming a first semiconductor layer including Si on a substrate, wherein the first semiconductor layer does not include Ge;
   forming a second semiconductor layer including Ge at a first concentration on the first semiconductor layer;
   performing a first thermal process on the first semiconductor layer and the second semiconductor layer to form a third semiconductor layer having Ge at a second concentration;
   sequentially forming fourth and fifth semiconductor layers including Ge at third and fourth concentrations higher than the second concentration on the third semiconductor layer; patterning the third to fifth semiconductor layers to form a fin type structure;

forming a preliminary fin type active pattern including Ge at a fifth concentration higher than the second concentration and lower than the third concentration by performing a second thermal process on the fin type structure; and oxidizing a surface of the preliminary fin type active pattern to form a fin type active pattern including Ge at a sixth concentration greater than the fifth concentration.

15. The method of claim 14, wherein the patterning of the third to fifth semiconductor layer comprises:

patterning a top portion of the insulation layer, wherein a horizontal width of the top portion of the patterned insulation layer is substantially equal to that of the patterned third semiconductor layer.

16. A method of fabricating a semiconductor device, the method comprising:

forming a plurality of semiconductor layers including Ge and Si on a substrate, wherein the semiconductor layers have different concentrations of Ge from each other;

patterning the semiconductor layers to form at least one fin type structures;

performing a thermal heat process to form at least one preliminary fin type active patterns, wherein Ge of the patterned semiconductor layers is diffused so that the preliminary fin type active patterns include Ge at a first concentration; and oxidizing surfaces of the preliminary fin type active patterns to form a plurality of fin type active patterns, wherein the fin type active patterns include Ge at a second concentration that is greater than the first concentration.

17. The method of claim 16, wherein the substrate includes a silicon-on-insulator (SOI) substrate.

18. The method of claim 16, wherein the first concentration is between the lowest and the highest concentrations of Ge of the plurality of semiconductor layers, and the second concentration is greater than the highest concentration of Ge of the plurality of semiconductor layers.

19. The method of claim 17, wherein the lowermost semiconductor layer is in contact with an insulation layer of the SOI substrate, and wherein the patterning of the plurality of semiconductor layers includes patterning partially an upper portion of the insulation layer of the SOI substrate.

20. The method of claim 17, wherein the semiconductor layers have different thicknesses from each other.

* * * * *